United States Patent [19]

Fujiwara

[11] 3,729,807

[45] May 1, 1973

[54] METHOD OF MAKING THERMO-COMPRESSION-BONDED SEMICONDUCTOR DEVICE

[75] Inventor: Shohei Fujiwara, Takatsuki, Japan

[73] Assignee: Matsushita Electronics Corporation, Kadoma, Osaka Prefecture, Japan

[22] Filed: Oct. 29, 1971

[21] Appl. No.: 193,956

[30] Foreign Application Priority Data

| | | |
|---|---|---|
| Oct. 30, 1970 | Japan | 45/96128 |
| Nov. 5, 1970 | Japan | 45/97672 |
| Nov. 5, 1970 | Japan | 45/97673 |
| Nov. 7, 1970 | Japan | 45/98605 |

[52] U.S. Cl. ..................29/473.1, 29/472.9, 29/475, 29/502, 29/504, 117/107, 117/217, 317/234 L

[51] Int. Cl. ..............................................B23k 31/02

[58] Field of Search.....................29/473.1, 413, 475, 29/589, 482, 504, 502, 472.9; 317/234 L; 117/107, 217

[56] References Cited

UNITED STATES PATENTS

| | | | |
|---|---|---|---|
| 3,078,559 | 2/1963 | Thomas | 29/413 X |
| 3,207,838 | 9/1965 | McCormack | 29/473.1 X |
| 3,273,979 | 9/1966 | Budnick | 29/473.1 X |
| 3,585,711 | 6/1971 | Hicks | 29/473.1 X |
| 3,618,202 | 11/1971 | Callahan et al. | 29/589 X |
| 3,651,562 | 3/1972 | Hambleton | 29/473.1 |
| 3,673,478 | 6/1972 | Osoegawa | 317/234 L |
| 3,680,199 | 8/1972 | Johnson | 317/234 L |

*Primary Examiner*—J. Spencer Overholser
*Assistant Examiner*—Richard Bernard Lazarus
*Attorney*—Craig, Antonelli, Hill

[57] ABSTRACT

In making a semiconductor device comprising a die of silicon, germanium or gallium arsenide, the bonding of the die onto a metal header (i.e., holding member) is made firmly without insertion of a conventional thin gold film therebetween, by depositing gold onto the bonding face of a slice, which is to be cut into the die, in such a manner that at least the surface of the deposited layer is gold or an alloy of gold containing small amounts of an additive.

5 Claims, 6 Drawing Figures

METHOD OF MAKING THERMO-COMPRESSION-BONDED SEMICONDUCTOR DEVICE

BACKGROUND OF THE INVENTION

This invention relates to an improvement in the method of making semiconductor, which method includes a thermocompression bonding of a semiconductor wafer or die to the header (i.e., holding member).

Hitherto, in making a semiconductor device comprising a die of silicon, germanium or gallium arsenide, the bonding of the die onto a metal header has generally been made by inserting a thin layer of gold between the die and the header, since gold makes a eutectic alloy with the abovementioned semiconductor die at low temperatures, and provides a strong bond.

In the conventional thermo-compression bonding method, the bonding was made by placing a thin piece of film of gold onto the header, made of a metal and plated with gold, placing the semiconductor die onto the gold film, and then heating them at a eutectic temperature, namely, 400° to 500°C for a certain period of time.

In order to reduce the number of steps for fabricating the semiconductor device before heat treatment, a method has been developed by the present inventor as preliminarily forming a thin layer of gold on the bottom face of the die, which face is to be bonded to the header, by such method as vapor deposition keeping a slice at room temperature. Such a method will eliminate insertion of a thin gold film between the header and the wafer and, therefore, will reduce the cost of manufacture. However, such a thin gold film, which is deposited in the usual manner, i.e., by vapor deposition at room-temperature or by conventional plating, does not provide a satisfactory bonding force, so that the gold film will peel off during the slice-cutting into dice or the thermo-compression bonding, causing a low yield rate. This undesirable peeling-off of the gold film is also likely to arise when a slice of semiconductor, one face of which is covered with the film, is cut into many small diced portions.

SUMMARY OF THE INVENTION

An object of this invention is to firmly bond semiconductor dice onto a header by a rather simple process. A further object of the invention is to make semiconductor devices with stable electric characteristics.

According to the present invention, a thin layer of gold and/or alloy of gold is firmly bonded on the rear face of the semiconductor die, so that the die can be firmly as well as stably bonded to the header by contacting said layer to a bonding face of the header, and by applying thermo-compression bonding.

BRIEF DESCRIPTION OF THE INVENTION

FIG. 1 is a sideview of a semiconductor device made by a method of the present invention, FIG. 2 (*a*) and FIG. 2 (*b*) are sideviews of a semiconductor slice in different steps of manufacture, In FIGS. 1, 2 (*a*) and 2 (*b*), the dimensional proportions are not of actual ones but are exaggerated for easy illustration, FIG. 3 is a graph indicating the relation between chromium concentration and bonding force i.e., tensile adhesion of the gold film to the silicon dice, FIG. 4 is a graph indicating distribution of bonding forces i.e., tensile adhesions between gold alloy layers and semiconductor substrates of various examples.

FIG. 5 is a graph indicating comparison of distribution of bonding forces i.e., tensile adhesions between gold layers and semiconductor substrates treated in roughening treatment.

DETAILED DESCRIPTION

The present invention is disclosed in detail in the following descriptions.

It is well known that semiconductors such as silicon, germanium or gallium arsenide form a eutectic alloy with gold at a GaAs-Au low temperature. The eutectic temperatures at which said eutectic alloys can be made are as follows:

| | |
|---|---|
| for Si-Au alloy | 370°C |
| for Ge-Au alloy | 356°C |
| for GaAAs-Au alloy | 341°C |

The inventor has discovered that, in a thermo-compression bonding method, wherein the bonding face of a semiconductor substrate is preliminarily coated with a thin layer of gold or alloy of gold and is then bonded onto the header of metal by means of thermo-compression bonding, the bonding force, i.e., tensile adhesion between the semiconductor substrate and the layer, is prominently improved by heating the semiconductor substrate upon a temperature higher than said eutectic temperature, during the formation of the layer.

For instance, my research shows that adhesion between a silicon slice and a layer of gold or alloy of gold is not strong, if the layer is made according to the conventional way, wherein the layer is vapor-deposited at room temperature, and the layer is likely to peel off when the slice is cut into dice. Namely, the adhesion between the silicon and the metal layer mainly depends upon the temperature of the slice when the vapor deposition is made. According to my research, among the dice cut from the slice, several percent of them peel off during slice-cutting or accidentally, when the vapor deposition is applied to the slice which is kept at a temperature under 250°C. On the other hand, when the deposition is applied to the slice which is kept at a temperature over 350°C, the face of the silicon slice becomes substantially above the eutectic temperature due to accumulation of heat from the vapor source and also from a vapor source heater, and all the deposited gold forms an alloy without remaining as metallic gold, i.e., gold, per se. Consequently, the adhesion between the layer of gold and the silicon slice becomes very strong, and on the other hand, bonding of the alloy layer to the metal header (holding member) becomes very difficult.

Accordingly, in order to have a good yield rate in manufacturing semiconductor devices, the deposition should be controlled so as to retain metallic-gold (i.e., gold, per se) portion on the surface of the layer of alloy between the gold and the silicon.

Figure 1:
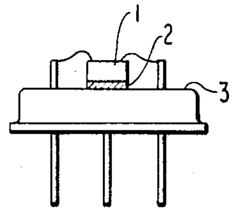
Figure 2A:
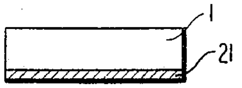
Figure 2B:
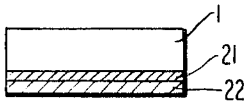

In order to obtain the above-mentioned controlled deposition, it is preferable to divide the vapor deposition in two steps, wherein the first step of vapor deposition of gold is carried out while keeping the slice at a temperature over 250°C, preferably over 350°C, so that the deposited face of the slice 1 exceeds the eutectic temperature and all the deposited gold forms a layer 21 of an alloy of gold as shown in FIG. 2 (*a*), and the second step is carried out while keeping the slice at a temperature under 250°C, so that the deposited face of the slice 1 does not exceed the eutectic temperature and the deposited gold forms a layer 22 of metallic gold as shown in FIG. 2 (*b*). By applying such dual step vapor deposition, peeling-off of the layer of gold as well as difficulty in bonding the alloy-coated face of the die to the header can be avoided.

It is also desirable to carry out both the first and the second vapor deposition steps in sequence, within one uninterrupted vacuum state. If the vacuum is interrupted between the first and the second steps, due to oxidization of the surface of the alloy layer 21, the adhesion between the alloy layer and the subsequently applied gold layer 22 might become weak, causing the possibility of peeling-off of the gold layer to become high.

In a practical vapor deposition process, it is preferred to employ a pair of vaporizing sources, of which a first source is for use in said first step and a second source is alternatively used in said second step.

By providing two sources, it is easy to control the thickness of the alloy layer 21 and that of the gold layer 22, respectively. Namely, the respective thickness are defined by defining amounts of gold appropriately in respective sources and by completely vaporizing the sources for respective steps.

The alloy layer 21 as well as the gold layer 22 should be over 1,000A thick, and my research proves a thickness between 1,000A and 5,000A is preferable because of stable bonding. However, the sum of thicknesses of both layers 21 and 22 should not exceed 10,000A, since in case of a layer thickness of more than 10,000A, the layers 21 and 22 are liable to peel off from the slice when the slice is cut into diced portions.

As the gold for use in said sources for vapor deposition, a piece of gold containing a small amount of impurity or impurities such as aluminum, gallium and/or antimony is used for giving the desired type of conductivity to the semiconductor substrate 1 simultaneously with coating the above-mentioned layers. Especially, it is possible to give high conductivity to a region just beneath the alloy layer 21, by means of such impurity contained in the gold piece of said first vapor deposition source, so that the electrical contacting resistance between the semiconductor substrate 1 and the metallic gold layer 22 is improved to a low value.

The slice, whose bonding face is coated with said alloy layer 21 and said metallic gold layer 22, is then cut into diced portions 1 of a desired size and shape, and is further bonded to the header 3 by a known thermo-compression bonding method, such as being compressed with a force of about 200 gr while heated to 420°C.

In the above-mentioned example, the disclosure relates to a semiconductor device comprising silicon dice; however, the same can be applicable also to a semiconductor device comprising germanium dice or gallium arsenide dice.

In further research the inventor discovered the fact that if the vapor deposition of gold is carried out by employing a vapor source of gold comprising a small amount of chromium, the alloy layer 21 formed contains a certain amount of chromium.

The chromium has a feature that its adhesion to silicon is great. Moreover chromium has a feature that its relative vaporization rate, defined by $P/\sqrt{M}$, where P is vapor pressure and M is atomic weight, is very close to that of gold. Accordingly, when the vapor deposition is made by employing the gold piece containing chromium as the vapor source, ratios of chromium to gold in the deposited layers become substantially the same with that of the gold piece.

Figure 3:
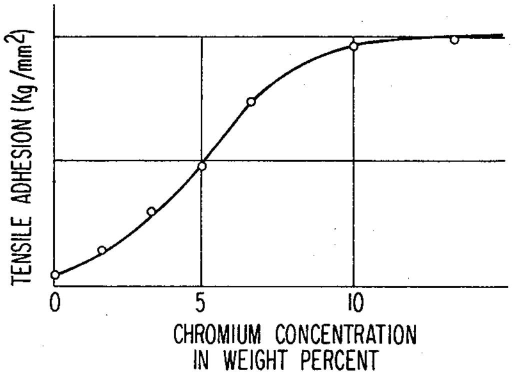

The research proved that adhesion of the alloy layer 21 to silicon substrate 1 gradually increases as concentration of chromium increases, as shown in FIG. 3.

Also in according to the research, the adhesion is not sufficient in the case of chromium concentration of less than 1 weight percent, while in the case of over 10 percent weight of chromium the adhesion saturates and contact resistance increases, since the chromium is likely to be oxidized. Especially, the oxidization of the chromium is prominent when the vapor deposition is made in a low vacuum (i.e., air is thicker) than $1 \times 10^{-5}$ torr. Accordingly, the preferred range of chromium content to gold ratio is 1 to 10 percent weight.

The temperature of the slice 1 at the vapor deposition of said chromium-containing gold is preferably under 300°C in order to avoid excessive alloying reaction of the deposited metal with the silicon substrate.

One practical example is as follows: A slice, on which many transistor patterns are already provided by, for instance, a series of diffusion processes, is heated to about 150°C during vapor deposition of chromium containing gold onto the bonding face of the slice, so that a gold layer of about 4,000A containing about 3 percent chromium is provided on said face. The deposition is made in a vacuum of about $1 \times 10^{-5}$ torr. Then the slice is cut into square die pieces of 0.5 mm × 0.5 mm by known slice-cutting process. Then the semiconductor die is bonded onto a metal header (holding member) whose die-receiving face is preliminarily gold-plated by known thermo-compression bonding method at a temperature of 420°C. A transistor made according to said steps attains as good a result in saturation voltage to current characteristic as the conventional bonding method with a thin film inserted between the die and the header. Since by the above-mentioned plating of the film of gold or of chromium containing gold onto said bonding face of the slice, the troublesome step of inserting a small film piece between the dice and the header can be eliminated; there is considerable saving in the time required for fabrication of parts. This chromium containing deposition is applicable to any semiconductor of silicon, germanium or gallium arsenide.

In further research the inventor discovered the fact that in the above-mentioned vapor deposition of gold onto the bonding face of the slice, the use of silicon-containing gold (Au-Si) or germanium-containing gold (Au-Ge) as the vapor source provides good results. The vapor pressures (P) and the $P/\sqrt{M}$ value of silicon and germanium do not differ much from those of gold as indicated in the following table:

| Temperature | 1,200° C. | | 1,400° C. | | 1,600° C. | | 1,800° C. | |
|---|---|---|---|---|---|---|---|---|
| Element | P (torr) | $P/\sqrt{M}$ | P (torr) | $P/\sqrt{M}$ | P (torr) | $P/\sqrt{M}$ | P (torr) | $P/\sqrt{M}$ |
| Au | $3.9\times10^{-4}$ | $2.8\times10^{-5}$ | $1.1\times10^{-2}$ | $7.9\times10^{-4}$ | $1.5\times10^{-1}$ | $1.1\times10^{-2}$ | $1.3\times10^{0}$ | $9.3\times10^{-2}$ |
| Ge | $3.5\times10^{-4}$ | $4.1\times10^{-5}$ | $1.1\times10^{-2}$ | $1.3\times10^{-3}$ | $1.6\times10^{-1}$ | $1.9\times10^{-2}$ | $9.1\times10^{-1}$ | $1.1\times10^{-1}$ |
| Si | $4.0\times10^{-6}$ | $7.5\times10^{-7}$ | $3.0\times10^{-4}$ | $5.7\times10^{-5}$ | $6.5\times10^{-3}$ | $1.2\times10^{-3}$ | $8.2\times10^{-2}$ | $1.5\times10^{-2}$ |
| $P/\sqrt{M}$ (Ge)/$P/\sqrt{M}$ (Au) | 1.5 | | 1.6 | | 1.7 | | 1.2 | |
| $P/\sqrt{M}$ (Si) $P/\sqrt{M}$ (Au) | $2.7\times10^{-2}$ | | $2.7\times10^{-2}$ | | $1.1\times10^{-1}$ | | $1.6\times10^{-1}$ | |

Accordingly, when the gold containing silicon or germanium is used as a source of vapor deposition, the ratio of the content of silicon or germanium to that of gold in the deposited film can be made almost the same as the corresponding ratio in the source. In case of Au-Si deposition, though the vapor pressure of gold is larger than that of silicon, it is possible to obtain similar ratio by quick heating of source.

The research proved that in case of a Au-Si vapor source, the preferable range of silicon content is 1 to 10 weight percent, and in case of Au-Ge vapor source, the preferable range of germanium content is 1 to 15 weight percent, respectively, for the above-mentioned vapor deposition. Since silicon and germanium are likely to be oxidized, the vapor deposition should be made in a high vacuum, otherwise oxidization of silicon or germanium causes insufficient bonding and an increase of contact resistance between the semiconductor die and the header. The merit of improving the adhesion is not sufficient in case within 1 percent of silicon or germanium, while in case of more than 10 percent silicon or 15 percent of germanium, a possibility of oxidization of the deposited metal layer increases and also contact resistance increases. In the above-mentioned deposition of gold containing silicon or germanium, the preferred temperature of the slice during the deposition is under 350°C, and the temperature may be as low as the room temperature. The thickness of the deposited film should be over 1,000A for improved adhesion. Experimentally, the optimum thickness is found to be between 2,000A –5,000A for attainment of a stable technical improvement.

It is preferable to further include a small amount of an impurity element such as antimony (Sb), gallium (Ga), aluminum (Al), etc. in addition to the above-mentioned silicon or germanium, in order to obtain good electrical conduction as well as good adhesion.

Figure 4:
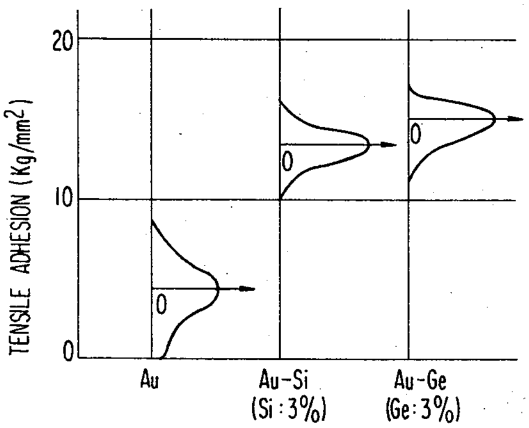

FIG. 4 indicates a comparison of adhesion of a gold layer containing 3 percent by weight of silicon formed on a silicon substrate, with adhesion of a 100 percent gold layer formed on a similar silicon substrate. As is indicated in FIG. 4 the adhesion is prominently improved by the small addition of silicon or germanium in the gold layer. This silicon or germanium-containing gold layer is applicable to any slice of silicon, germanium or gallium arsenide.

Further, the research disclosed that in the aforementioned processes of vapor deposition, in order to attain firm adhesion in vapor deposition at the temperature of the slice that would not be sufficient to make the deposited layer into an alloy with the semiconductor material of the substrate, it is preferable to make the bonding face of the semiconductor dice as a rough surface prior to vapor deposition of the gold.

Figure 5:
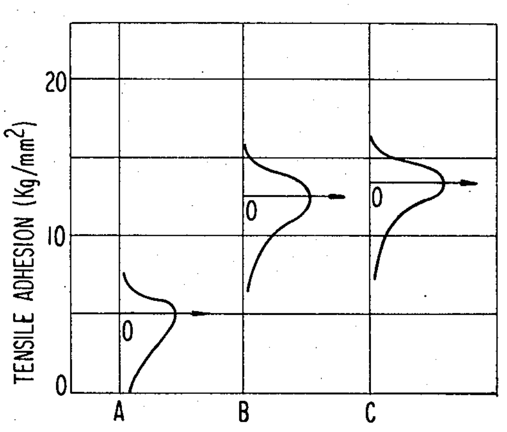

FIG. 5 indicates a comparision between the adhesions of the above-mentioned roughened method and non-roughened method. In FIG. 5, curve B and C indicate respective adhesion between a deposited gold layer and a silicon die when the vapor deposition of gold is carried out after sand-blasting with alumina ($Al_2O_3$) powder of about 3 $\mu$ diameter and of about 16$\mu$ diameter, respectively, while the curve A indicates the adhesion when the deposition is made without such sand-blasting. The adhesion is measured as follows: a first gold layer of about 4,000A thick is deposited on a silicon slice kept at 250°C, and then a second layer of chromium-containing gold is deposited on said first layer through a 2mm diameter hole of a mask, to form a chromium layer on the gold layer and a copper layer on the chromium layer, and finally a copper wire of 0.5 mm diameter is secured perpendicularly to said layer by soldering. The adhesion is defined as the force required for peeling off the wire together with the layers of gold from the silicon slice when the wire is pulled perpendicularly to the face of the silicon slice. This graph indicates that in case of employment of sand-blasting by the alumina powder, even when the deposition of the gold layer is carried out at a slice temperature under 350°C, the bonded layer has such a firm adhesion to the semiconductor substrate that it does not peel off. The reason is, presumably, that by roughening the face to be vaporized, the contact area considerably increases and, moreover, infiltrated gold into flaws and microcracks caused by sand-blasting will increase the adhesion. Furthermore, in case of the slice-cutting, these flaws and microcracks of the deposited gold layer will help easy cutting of the gold layer, thereby minimizing peel-off of the gold layer.

In this example, the disclosure is directed to a semiconductor device comprising a silicon dice; however, the same can be applicable also to a semiconductor device comprising germanium dice or gallium arsenide dice.

I claim:

1. In a method of making semiconductor devices comprising the steps of:

cutting a slice into dice on which patterns of a number of units of semiconductor devices are formed and thermo-compression bonding a die to a header, the improvement comprising vapor-depositiong a layer, at least the surface of which is gold or a gold alloy containing a small amount of an additive, onto a bonding face of said slice prior to the step of cutting said slice into dice wherein the vapor deposition of the layer comprises two steps the first deposition step being carried out while keeping the temperature of the bonding face of the semicondictor above the eutectic temperature of an alloy between the gold and the semiconductor, and the second deposition step being carried out while keeping the temperature of the bonding face of the semiconductor slice below said eutectic temperature.

2. The method of claim 1, wherein said vapor-deposited layer is a layer of an alloy of gold containing 1 to 10 percent of chromium by weight.

3. The method of claim 1, wherein said vapor-deposited layer is a layer of an alloy of gold containing 1 to 10 percent of silicon by weight.

4. The method of claim 1, wherein said vapor deposited layer is a layer of an alloy of gold containing 1 to 15 percent of germanium by weight.

5. The method of claim 1, further comprising the step of sand-blasting the bonding face of the slice prior to vapor deposition.

* * * * *